United States Patent [19]

Hughes et al.

[11] 4,240,090
[45] Dec. 16, 1980

[54] ELECTROLUMINESCENT SEMICONDUCTOR DEVICE WITH FIBER-OPTIC FACE PLATE

[75] Inventors: Frederick R. Hughes, Lancaster; Paul Nyul, New Holland, both of Pa.

[73] Assignee: RCA Corporation, New York, N.Y.

[21] Appl. No.: 915,309

[22] Filed: Jun. 14, 1978

[51] Int. Cl.³ .................. H01L 27/14; H01L 31/00; H01L 23/02
[52] U.S. Cl. ........................ 357/30; 357/17; 357/74; 357/81; 313/475; 350/96.27
[58] Field of Search .......... 350/96.27, 96.20; 357/17, 30, 81, 74, 18, 19, 74, 65; 313/475, 110

[56] References Cited

U.S. PATENT DOCUMENTS

| 3,244,921 | 4/1966 | Behun | 350/96.27 |
|---|---|---|---|
| 3,283,207 | 11/1966 | Klein | 357/17 |
| 3,624,462 | 11/1971 | Phy | 357/65 |
| 3,703,660 | 11/1972 | Fyler | 350/96.27 |
| 3,936,855 | 2/1976 | Goell et al. | 357/17 |
| 3,946,416 | 3/1976 | Hacskaylo | 357/17 |
| 3,951,698 | 4/1976 | Wilson et al. | 357/17 |
| 3,974,514 | 8/1976 | Kressel et al. | 357/17 |
| 4,058,750 | 11/1977 | Schoberl | 357/17 |
| 4,110,661 | 8/1978 | Harris et al. | 357/17 |
| 4,131,904 | 12/1978 | Ladan et al. | 357/17 |
| 4,139,261 | 2/1979 | Hilsum | 350/96.27 |

FOREIGN PATENT DOCUMENTS 2313688 12/1976 France ................. 350/96.20

*Primary Examiner*—Andrew J. James
*Attorney, Agent, or Firm*—Harold Christoffersen; Donald S. Cohen

[57] ABSTRACT

A fiber-optic face plate is mounted across the light emitting surface of an electroluminescent semiconductor element so that the light emitted from the semiconductor element passes through the face plate. The electroluminescent semiconductor element may be enclosed in a housing with the face plate extending across and being hermetically sealed to an end of the housing.

8 Claims, 2 Drawing Figures

ELECTROLUMINESCENT SEMICONDUCTOR DEVICE WITH FIBER-OPTIC FACE PLATE

The present invention relates to an electroluminescent semiconductor device having a fiber-optic optical output and particularly to such a device in which the optical output is through a face plate made up of a bundle of optical fibers.

Electroluminescent semiconductors are being used more widely as sources of light. Such semiconductor elements in general include regions of opposite conductivity type forming a PN junction therebetween at which light is generated when the device is properly biased. One type of electroluminescent semiconductor element is the edge emitting device in which the light is emitted from an edge surface which extends transversely across the PN junction. One problem with such edge emitting electroluminescent semiconductor elements is that the emitted beam of light is oval in shape rather than round. Such an oval shaped beam is more difficult to couple to other optical elements, such as the round end of an optical fiber, than a round beam.

Another problem with the use of electroluminescent semiconductor elements arises when it is necessary to protect the semiconductor element by enclosing it in an hermetic housing and still provide for ease of coupling the light output to other optical devices. One technique which has been used is to hermetically enclose the electroluminescent semiconductor element in a housing and provide a coupling device, such as an optical fiber, which extends from the semiconductor element in the housing through an opening in the housing. However, this requires a good hermetic seal between the housing and the coupling means, which is often difficult to achieve, as well as some technique for properly aligning the coupling means with the semiconductor element within the housing.

Figure 1:
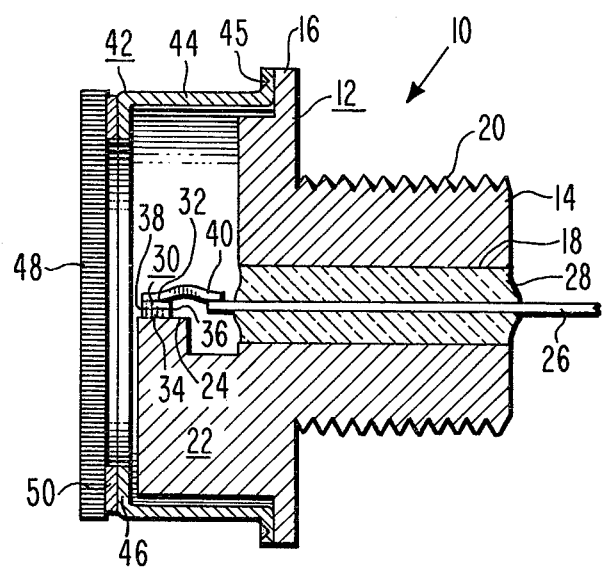
FIG. 1 is a sectional view of one form of an electroluminescent semiconductor device embodying the present invention.

Referring to FIG. 1, one form of the electroluminescent semiconductor device is generally designated as 10. The electroluminescent semiconductor device 10 includes a metal header 12 having a cylindrical stem 14 and an annular flange 16 extending radially from one end of the stem. The stem 14 has a passage 18 extending along its longitudinal axis, and a threaded outer surface 20. A mounting pedestal 22 projects from the flange 16 away from the stem 14. The mounting pedestal 22 has a flat mounting surface 24 which is substantially parallel to the longitudinal axis of the stem 14.

A lead wire 26 extends through the passage 18 and is sealed in the passage 18 by a bushing 28 of an electrical insulating material, such as glass or plastic. The lead wire 26 projects beyond both ends of the passage 18 and has one end adjacent to but spaced from the mounting surface 24.

An electroluminescent semiconductor element 30 is mounted on the mounting surface 24. The electroluminescent semiconductor element 30 is preferably an edge emitting element which, in general, includes regions 32 and 34 of opposite conductivity type forming a PN junction 36 therebetween and a light emitting edge surface 38 which extends transversely across the PN junction 36. The electroluminescent semiconductor element 30 is mounted on the mounting pedestal 22 with one of the regions 34 being mechanically and electrically connected to the mounting surface 24 and the light emitting edge surface 38 facing away from the lead wire 26. The region 32 of the electroluminescent semiconductor element 30 is electrically connected to the lead wire 26 by a terminal wire 40. The electroluminescent semiconductor element 30 may be with either a light emitting diode or a laser diode and may be of any specific construction well known in the art for such diodes. For example, the electroluminescent semiconductor element 30 may be of a structure such as shown in U.S. Pat. No. 3,974,514 to H. Kressel et al., issued Aug. 10, 1976.

A metal housing 42 extends around the mounting pedestal 22 and the electroluminescent semiconductor element 30. The housing 42 includes a cylindrical wall 44 having a radially outwardly extending lip 45 at one end which is seated on and hermetically sealed to, such as by welding or the like, the flange 16 of the header 12. A radially inwardly extending lip 46 is on the other free end of the cylindrical wall 44. A fiber-optic face plate 48 extends across the open end of the housing 44 and is hermetically sealed to the lip 46 by a sealing ring 50 of a soft metal, such as indium. The fiber-optic face plate 48 is made up of a bundle of short optical fibers secured together in parallel relation. The construction of such a fiber-optic face plate and a method of making the same is shown and described in U.S. Pat. No. 3,226,589 to R. F. Woodcock, issued Dec. 28, 1965, entitled, "FIBER TYPE LIGHT TRANSFERRING DEVICES AND METHOD OF MAKING THE SAME".

In the assembling of the electroluminescent semiconductor device 10, after the electroluminescent semiconductor device 30 is mounted on the mounting pedestal 22 and electrically connected to the lead wire 26, the housing 42 is mounted on and sealed to the flange 16 of the header 12. The fiber-optic face plate 48 is then placed against the lip 46 of the housing 42 with the soft metal sealing ring 50 being between the face plate and the lip. Sufficient pressure is applied between the face plate and the lip 46 to cause deformation of the sealing ring 50 and to cause the sealing ring to be bonded to both the face plate and the lip. This not only seals the face plate to the housing 44 by an hermetic seal, but also allows control of the distance between the face plate 48 and the light emitting surface 38 of the electroluminescent semiconductor device 30 by controlling the amount of deformation of the sealing ring 50.

In the operation of the electroluminescent semiconductor device 10, when the electroluminescent semiconductor element 30 is properly biased by applying a voltage between the lead wire 26 and the stem 14, light is emitted from the light emitting edge surface 38 of the electroluminescent semiconductor element. The light will impinge on the inner surface of the fiber-optic face plate 48 and will pass through the fibers of the face plate to the outer surface of the face plate. We have found that even though the beam of light emitted from the electroluminescent semiconductor element 30 is oval, the beam of light at the outer surface of the face plate 48 is round. The round beam of light emanating from the outer surface of the face plate 48 can then be easily coupled to some other type of optical element. For example, the round end of an optical fiber can be placed directly against the outer surface of the face plate 48 to receive the light emitted therefrom.

Thus, the electroluminescent semiconductor device 10 provides an electroluminescent semiconductor device which is hermetically sealed in a housing yet permits ease of coupling of the light emitted from the electroluminescent semiconductor device to other optical devices, since the fiber-optic face plate converts the oval shaped light beam emitted from the electroluminescent semiconductor element to a round light beam. In addition, the electroluminescent semiconductor device 10 provides for ease of controlling the distance between the fiber-optic face plate and the electroluminescent semiconductor device while the device is being assembled.

Figure 2:
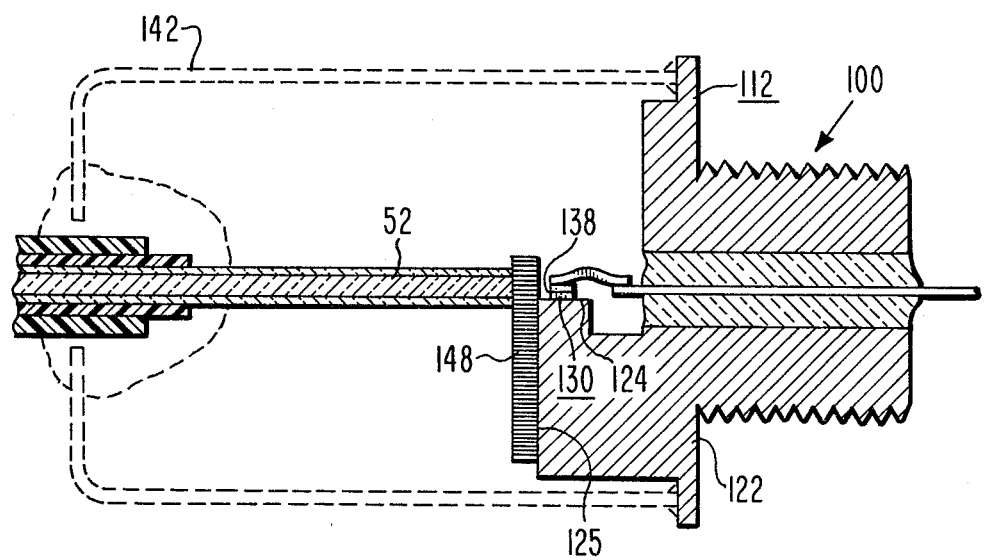
FIG. 2 is a sectional view of another form of an electroluminescent semiconductor device embodying the present invention.

Referring to FIG. 2, another embodiment of the electroluminescent semiconductor device is generally designated as 100. The electroluminescent semiconductor 100 includes a header 112 which is of the same construction as the header 12 of the electroluminescent semiconductor device 10 shown in FIG. 1 An electroluminescent semiconductor element 130 is mounted on the mounting surface 124 of the header 112. The electroluminescent semiconductor device 130 is of the same construction as the electroluminescent semiconductor element 30 of the electroluminescent semiconductor 10 shown in FIG. 1. A fiber-optic face plate 148 is secured to the end surface 125 of the mounting surface 122 and extends across the light emitting edge surface 138 of the electroluminescent semiconductor element 130. The fiber-optic face plate 148 is of a construction similar to that of the fiber-optic face plate 48 of the electroluminescent semiconductor 10 shown in FIG. 1 except that it can be smaller in size. In the operation of the electroluminescent semiconductor 100, the light emitted from the electroluminescent semiconductor element 130 passes through the fiber-optic face plate 148 and appears as a round beam at the outer surface of the face plate. If desired, the space between the emitting edge surface 138 of the electroluminescent semiconductor element 130 and the fiber-optic face plate 148 may be filled with a material which is light transparent and which has an index of refraction similar to that of the fiber-optic face plate, such as an epoxy resin, so as to achieve an improved transmission of light to the outer surface of the face plate.

The electroluminescent semiconductor device 100 can be used where it is not necessary to hermetically enclose the electroluminescent semiconductor element. As shown in FIG. 2, the light from the electroluminescent semiconductor device 100 can be coupled to an optical device, such as an optical fiber 52 by placing the end of the optical fiber directly against the outer surface of the fiber-optic face plate 148. If desired, the optical fiber 52 may be mounted in place by a housing 142, shown in dotted lines in FIG. 2 Instead of coupling the light directly to an optical fiber, the housing 142 may have a lens across its open end which will direct the light emitted from the fiber-optic face plate 148 in a desired manner. The housing 142 would then be of a length to match the optical characteristics of the lens.

We claim:

1. An electroluminescent semiconductor device comprising:
    an electroluminescent semiconductor element having regions of opposite conductivity type forming a PN junction therebetween and a light emitting surface extending transversely across the PN junction, said electroluminescent semiconductor element adapted to emit a beam of light from the light emitting surface, and
    a fiber optic face plate extending across said light emitting surface of the electroluminescent semiconductor element so that the light beam emitted from the electroluminescent semiconductor element will pass through the face plate.

2. An electroluminescent semiconductor device in accordance with claim 1 in which the fiber-optic face plate comprises a plurality of optical fibers secured together in parallel relation.

3. An electroluminescent semiconductor device in accordance with claim 1 including a header with the electroluminescent semiconductor element and the fiber-optic face plate being supported on said header.

4. An electroluminescent semiconductor device in accordance with claim 3 including a housing mounted on the header and extending around the electroluminescent semiconductor element and the fiber optic face plate is secured to the housing so that the face plate, housing and header hermetically enclose the electroluminescent semiconductor element.

5. An electroluminescent semiconductor device in accordance with claim 4 in which the header includes a cylindrical stem and an annular flange at one end of the stem, the housing includes a cylindrical wall secured at one end to the annular flange of the header and a radially extending lip at the other end of the cylindrical wall, and the fiber-optic face plate extends across the open end of the housing and is sealed to the lip of the housing.

6. An electroluminescent semiconductor device in accordance with claim 5 including a seal ring of a soft metal between the fiber-optic face plate and the lip of the housing sealing the face plate to the housing.

7. An electroluminescent semiconductor device in accordance with claim 3 in which the header includes a mounting pedestal on which both the electroluminescent semiconductor element and the fiber-optic face plate are mounted.

8. An electroluminescent semiconductor device in accordance with claim 7 in which the mounting pedestal has a first surface on which the electroluminescent semiconductor element is mounted with the light emitting surface facing away from the header, and a second surface on which the fiber-optic face plate is mounted with a portion of the face plate extending across the light emitting surface of the electroluminescent semiconductor element.

* * * * *